(12) United States Patent
Draving

(10) Patent No.: US 6,362,614 B2
(45) Date of Patent: Mar. 26, 2002

(54) ELECTRONIC PROBE FOR MEASURING HIGH IMPEDANCE TRI-STATE LOGIC CIRCUITS

(75) Inventor: Steven D Draving, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/755,265

(22) Filed: Jan. 5, 2001

Related U.S. Application Data

(63) Continuation-in-part of application No. 09/183,468, filed on Oct. 30, 1998, now Pat. No. 6,175,228.

(51) Int. Cl.$^7$ .............................................. G01R 31/02
(52) U.S. Cl. ....................... 324/72.5; 324/149; 324/754
(58) Field of Search ................. 324/72.5, 149, 324/754, 158.1; 333/81 A

(56) References Cited

U.S. PATENT DOCUMENTS 3,960,004 A * 6/1976 Wirt et al. .................... 73/589
6,175,228 B1 * 1/2001 Zamborelli et al. ........ 324/72.5
6,225,816 B1 * 5/2001 Draving et al. ............. 324/754

* cited by examiner

*Primary Examiner*—Ernest Karlsen
*Assistant Examiner*—Russell M. Kobert

(57) ABSTRACT

An electronic probe has a termination portion, a filter, and an impedance device. The termination portion is connected between a transmission line end and a common node. The termination portion has a termination resistor and a termination capacitor connected in series between the transmission line end and the common node. The filter has a resistor connected in parallel with a capacitor and an inductor connected in series with the filter resistor and filter capacitor combination. The components are connected between the transmission line end and an output. An impedance device is connected between the output and the common node. A zero is associated with the termination portion and a pole is associated with the filter. The frequency of the zero is approximately equal to the frequency of the pole. The probe provides a device for measuring tri-state logic circuits without overloading the circuits.

16 Claims, 2 Drawing Sheets

ELECTRONIC PROBE FOR MEASURING HIGH IMPEDANCE TRI-STATE LOGIC CIRCUITS

This application is a Continuation-in-Part of U.S. application Ser. No. 09/183,468 filed on Oct. 30, 1998, now U.S. Pat. No. 6,175,228, which is hereby incorporated by reference for all that is disclosed therein.

TECHNICAL FIELD OF THE INVENTION

The present invention relates to an electronic probe and, more particularly, to an electronic probe providing a high impedance input at direct current so as not to lower the impedance of a high impedance device under test. The probe further provides a low impedance input at high frequencies in order to provide improved sensitivity without amplification.

BACKGROUND OF THE INVENTION

Tri-state logic devices have a high, a low, and a high impedance mode. In the high mode or logic one mode, a tri-state logic device outputs a high voltage. In the low mode or logic zero mode, the tri-state logic device outputs a low voltage or zero volts. In the high impedance mode, the output of the tri-state logic device is neither high nor low, but rather is a high impedance output. Conventional logic devices typically have only high and low voltage modes.

Tri-state logic devices are used in many high speed communications systems because the properties of tri-state logic are adapted to accommodate multiple bus drivers. The communications are in the form of binary data consisting of high and low voltages output by the tri-state logic devices. Communications with tri-state logic devices also consist of the tri-state logic devices being in the high-impedance mode so as not to adversely affect data communications between several tri-state logic devices. For example, if the outputs of several tri-state logic are electrically connected together, only one tri-state logic device may be active. The other tri-state logic devices may be in the high impedance mode and thus will not affect the output of the active tri-state logic device.

Measuring voltages of circuits using tri-state logic devices presents many problems. For example, many tri-state logic buses have a plurality of conductors located in very small areas, which creates high concentrations of conductors in these areas. In order to measure the voltage of more than one conductor within a data bus at a time, the probes have to be very small. The probes must also not load the circuits being measured, which typically occurs when a conventional resistor divider probe is used to measure a tri-state logic circuit. For example, a conventional probe may load the output of a tri-state logic circuit that is in the high impedance mode.

Some probes use a plurality of devices in their tips in order to provide high impedance. For example, the tips may have a plurality active or passive devices located therein. These probes have many drawbacks when they are used to measure a plurality of highly concentrated conductors. Probes with a plurality of devices in their tips are bulky and may not be small enough to measure voltages on a circuit having a high concentration of conductors. Furthermore, probes with active devices or even a plurality of passive devices tend to be expensive and rather difficult to manufacture.

Therefore, a device is needed to overcome all or some of the above-described problems.

SUMMARY OF THE INVENTION

The invention is directed toward an electronic probe used to measure voltage over a broad frequency spectrum. The probe may comprise a probe tip, a transmission line, a termination portion, a filter, and an impedance device. The transmission line may have a transmission line first end and a transmission line second end, wherein the transmission line first end is connected to the probe tip. The termination portion may comprise a termination portion first end and a termination portion second end. The termination portion first end is connected to the transmission line second end and the termination portion second end is connected to a common node. The termination portion may comprise a termination resistor and a termination capacitor connected in series between the termination portion first end and the termination portion second end. The filter may comprise a filter first end and a filter second end. The filter first end is connected to the transmission line second end and the filter second end is connected to a probe output. The filter may comprise a filter resistor connected in parallel with a filter capacitor and a filter inductor connected in series with the filter resistor and filter capacitor combination. The impedance device may be connected between the probe output and the common node and may serve as a load.

The electronic probe provides high impedance for direct current voltages because the termination capacitor provides a direct current block for direct current and low frequency voltages. At higher frequencies, the impedance of the termination capacitor drops to an insignificant value. Thus, the impedance into the termination portion is substantially equivalent to the termination resistor. The termination resistor is selected to match the characteristic impedance of the transmission line, thereby reducing the incident-wave reflections.

The filter serves to offset the filtering affects inherent in the termination portion. Without the filter, the gain of the probe would vary significantly with the frequency of the measured voltage. By offsetting the filtering affects of the termination portion, the gain of the probe remains substantially constant over a broad frequency spectrum.

The probe may be electrically connected to a measurement device having an input capacitance associated therewith. The input capacitance acts as a filter and reduces the gain of the probe at high frequencies. The input capacitance also causes an impedance discontinuity that causes energy to reflect back toward the probe tip. The filter inductor serves to partially offset the effect of the input capacitance. Thus, the filter inductor offsets the capacitive discontinuity caused by the input capacitance and maintains the gain of the probe constant.

DETAILED DESCRIPTION OF THE INVENTION

Figure 1:
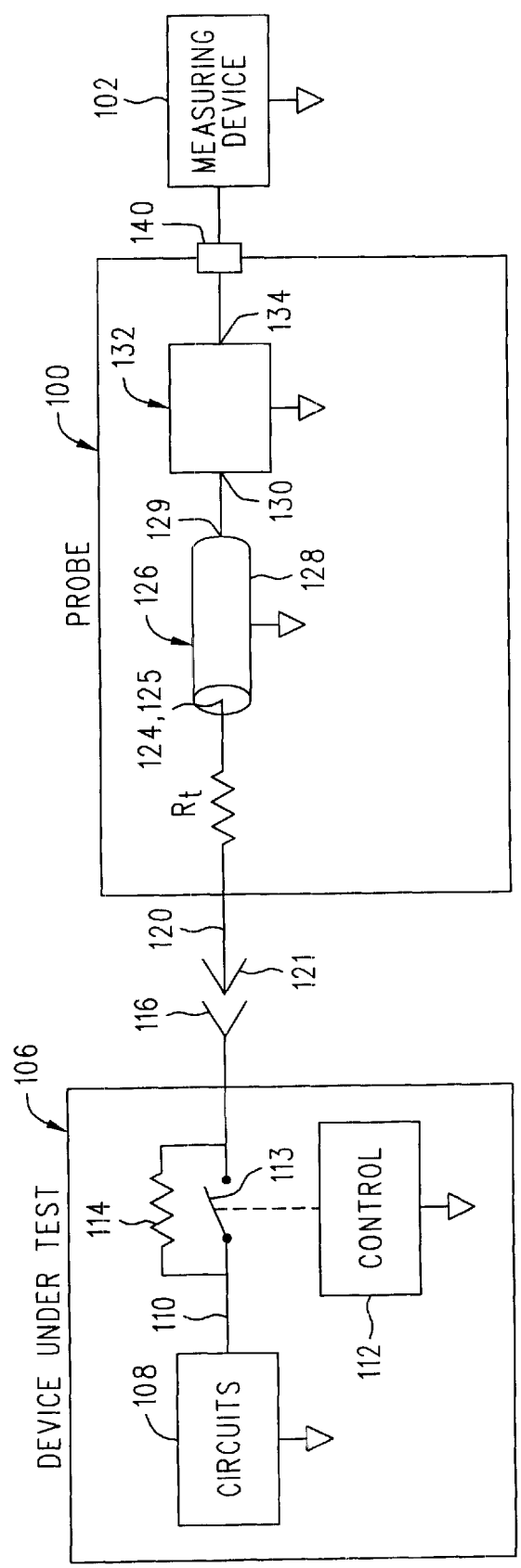
FIG. 1 is a block diagram of a probe being used to measure a device under test.

A block diagram of a non-limiting embodiment of a probe 100 associated with a measuring device 102 is illustrated in FIG. 1. The measuring device 102 in conjunction with the probe 100 is shown measuring a voltage in a device under test 106. The device under test 106 may, as a non limiting example, be a device using tri-state logic components and circuitry. The device under test 106 may have circuits 108 that generate voltages on an output line 110 wherein the voltages are reference to a common node, which may be a ground or, more precisely, an AC ground.

A simplified and non-limiting embodiment of a tri-state control 112 is illustrated within the device under test 106 and is used to model a tri-state logic circuit. The tri-state control 112 may control a switch 113. When the circuits 108 outputs high or low voltages on the output line 110, the tri-state control 112 closes the switch 113 and shorts an impedance 114. When the circuits 108 enters the high impedance mode, the tri-state control 112 opens the switch 113 which causes the device under test 106 to enter a high impedance mode. The high impedance is represented by the impedance 114. The output line 110 may have a node 116 associated therewith. The node 116 may, as examples, be a conductive land within the device under test 106 or a terminal, such as a connector used as an output terminal of the device under test 106. When the device under test is in the high impedance mode, the impedance into the device under test 106 referenced from the node 116 is approximately equal to the impedance 114. The output line 110 is shown to have zero resistance when the switch 113 is closed. It should be noted that a resistance, i.e., a resistor, may be located in the output line 110 so that a resistance is associated with the output line 110 when the switch 113 is closed.

When the device under test 106 is in use, the voltage on the output line 110 relative to ground may be representative of binary information and thus may vary. For example, the voltage may have a high state of 3.3 volts and a low state of 1.2 volts and may alternate between the high state and the low state at a frequency of several hundred megahertz. In addition, the device under test 106 may enter the high impedance mode wherein the switch 113 is open and the impedance into the device under test 106 is at least the value of the impedance 114.

When the device under test 106 is in the high impedance mode, the probe 100 must not cause the impedance of the output line 110 to be lowered when the probe 100 is connected to the output line 110. Lowering the impedance of the output line 110 defeats the purpose of the device under test 106 being in the high impedance mode. In addition, the probe 100 should have a constant gain from direct current through high frequencies. Otherwise, the voltages measured by the measuring device 102 will not reflect accurate values over a broad frequency spectrum.

Having described a non-limiting embodiment of the device under test 106, the probe 100 will now be described. The probe 100 may have a tip 120 associated therewith. A first side 121 of the tip 120 may be adapted to electrically contact the node 116 of the device under test 106. For example, the first side 121 of the tip 120 may be pointed so as to contact a land of a printed circuit board or it may have a connector attached thereto that mates with a connector on the device under test 106. A second side 122 of the tip 120 may be electrically connected to a tip resistor $R_t$. The tip resistor $R_t$ may be a discrete device or it may be intrinsic within the tip 120. The tip resistor $R_t$ may be electrically connected to a first end 124 of an inner conductor 125 of a transmission line 126. The transmission line 126 may have a shield 128 that is electrically connected to a common node, such as ground. The transmission line 126 may have an preselected characteristic impedance, such as fifty or seventy-five ohms.

A second end 129 of the inner conductor 125 of the transmission line 128 may be electrically connected to an input end or first end 130 of a matching network 132. The matching network 132 may have an output end or second end 134 that is electrically connected to a connector 140, such as a BNC connector. The connector 140 may provide an electrical transition between the probe 100 and the measuring device 102. As described in greater detail below, the matching network 132 serves to terminate the transmission line 126. In the situation where the device under test 106 is a tri-state logic device, the matching network 132 must compensate for the high impedance mode of operation by providing a high impedance input. In addition, the matching network 132 must maintain the gain of the probe 100 constant over a broad frequency spectrum in order to assure that voltages measured by the measuring device 102 are accurate over the frequency spectrum.

Figure 2:
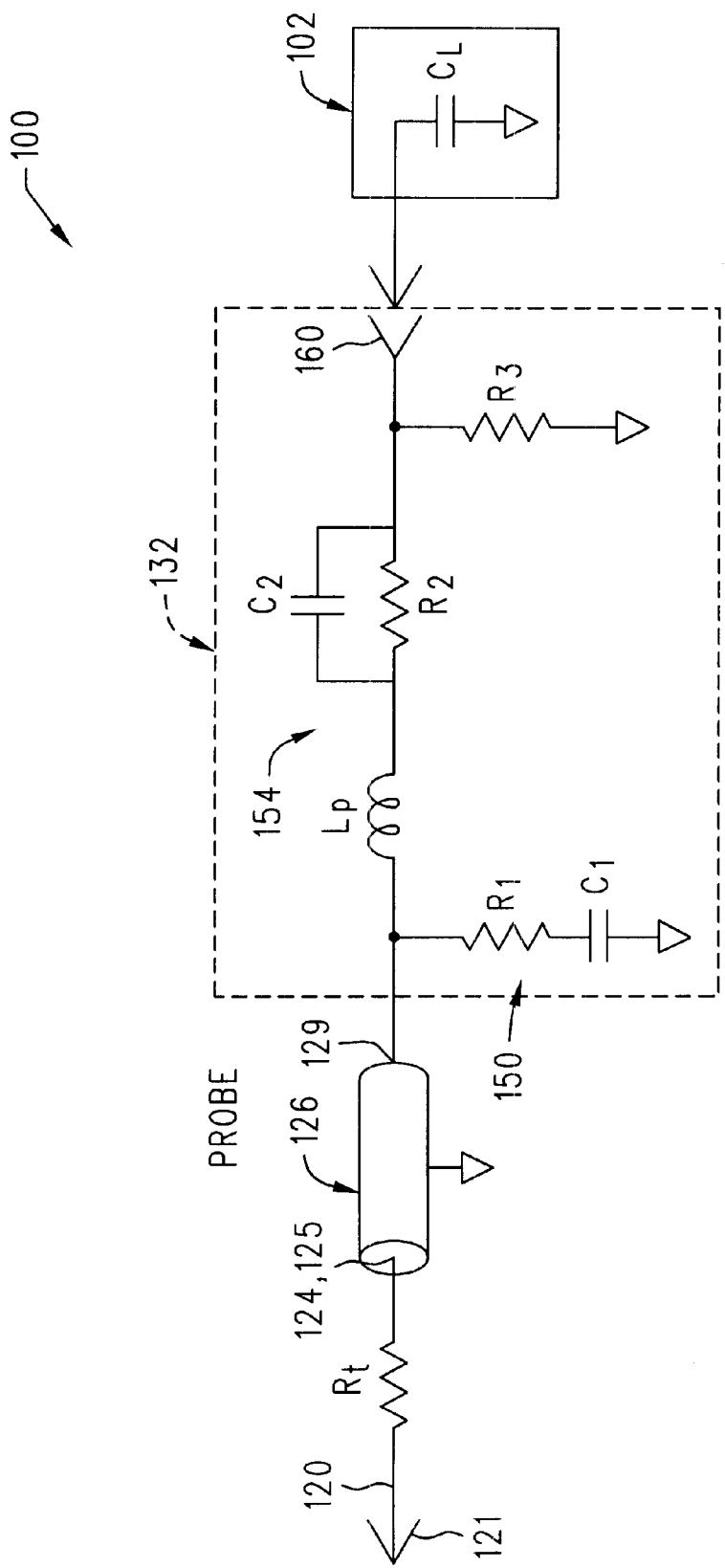
FIG. 2 is a detailed schematic illustration of the probe of FIG. 1.

A more detailed schematic illustration of a non-limiting embodiment of the matching network 132 is illustrated in FIG. 2. As shown in FIG. 2, the second end 129 of the inner conductor 125 of the transmission line 126 is electrically connected to a termination portion 150 and a filter 154. Both the filter 154 and the termination portion 150 are components of the matching network 132. The termination portion 150 may serve to match the transmission line 126 at high frequencies. The filter 154 may serve to compensate for the filtering effect of the termination portion 150 so as to minimize gain fluctuations of the probe 100 due to the frequency response of the termination portion 150. This compensation provides for the gain of the probe 100 at direct current to be substantially the same as the gain of the probe 100 at high frequency. As described in greater detail below, the flat gain is achieved by having the time constant of the filter 154 approximately equal to the time constant of the termination portion 150. Accordingly, the gain of the probe 100 remains substantially flat over a broad frequency spectrum.

The termination portion 150 may have a resistor $R_1$ and a capacitor $C_1$ connected in series between the second end 129 of the inner conductor 125 and a common node, such as an AC ground. The capacitor $C_1$ has a high impedance at low frequencies and a low impedance at high frequencies. Accordingly, at low frequencies, the impedance into the termination portion 150 is very high and at direct current the impedance is ideally infinite. At high frequencies, the impedance of the capacitor $C_1$ drops to an insignificant value relative to the value of the resistor $R_1$. Accordingly, the impedance into the termination portion 150 at high frequencies is approximately equal to the value of the resistor $R_1$, which is selected to match with the characteristic impedance of the transmission line 126.

The filter 154 may have an inductor $L_P$, a capacitor $C_2$, and resistors $R_2$ and $R_3$. The resistor $R_2$ may be connected in parallel with the capacitor $C_2$. The resistor $R_3$ may be connected between the junction of the resistor $R_2$ and the capacitor $C_2$ and a common node, such as the aforementioned AC ground. An output node 160 may be located at the junction of the capacitor $C_2$ and the resistors $R_2$ and $R_3$. The output node 160 may, as a non-limiting example, be a BNC connector. As described above, the filter 154 serves to maintain a substantially flat frequency response of the probe 100 over a wide frequency spectrum. The flat frequency response of the probe 100 is achieved, in part, by matching the frequency of the pole set by the capacitor $C_2$ to the frequency of the zero set by the capacitor $C_1$. Accordingly, as was described above, the time constant of the termination portion 150 is the same or substantially equal to the time constant of the filter 154. Therefore, the gain of the probe 100 remains substantially constant over a broad frequency spectrum. As is described below, the inductor $L_P$ serves to compensate for input capacitance of the measuring device 102.

As shown in FIG. 2, the measuring device 102 may be electrically connected to the output node 160 of the probe 100. The measuring device 102 may have an input capacitance $C_L$ associated therewith, wherein the value or approximate value of the input capacitance $C_L$ is known. The input capacitance $C_L$ affects the frequency response of the probe 100 by causing an impedance discontinuity that in turn causes energy to reflect from the measuring device 102 toward the transmission line 126.

The inductor $L_P$ is used to offset or otherwise compensate for the effect of the capacitance $C_L$. The inductor $L_P$ thus serves to "peak" the frequency response of the probe 100 so as to extend the relatively flat frequency response of the probe 100, thus compensating for the attenuation caused by the capacitance $C_L$. Accordingly, the impedance discontinuity caused by the capacitance $C_L$ is minimized and less energy is reflected from the measuring device 102. In one non-limiting embodiment, the value of the inductor $L_P$ is selected to be approximately equal to 0.4 multiplied by the value of the resistor $R_1$ squared and again multiplied by the value of the series combination of the capacitor $C_2$ and the capacitance $C_L$. It should be noted that the value of 0.4 may be varied depending on the intended use of the probe 100.

Having described the components of the probe 100, the operation of the probe 100 will now be described.

The probe 100 may be used to measure voltages at frequencies from direct current through relatively high frequencies. At direct current and low frequencies, the impedance of the capacitor $C_1$ is very high and may be considered to be an open circuit or infinite impedance. The inductor LP has a very low impedance at direct current and low frequency and may be considered to be a short circuit at direct current and low frequencies. Accordingly, at direct current and low frequencies, the gain of the probe 100 is established by resistors $R_t$, $R_2$, and $R_3$.

At higher frequencies, the impedance of the capacitor $C_1$ decreases to where the capacitor $C_1$ can be assumed to be a short circuit or close to zero impedance. Accordingly, the resistor $R_1$ serves as a terminating impedance for the transmission line 126. Without the filter 154, the gain of the probe 100 will not be flat as the frequency is increased due to the zero established by the termination portion 150, and more specifically, the zero associated with the capacitor $C_1$. Therefore, the filter 154 and more specifically, the capacitor $C_2$, establishes a pole to compensate for the zero of the termination portion 150. Accordingly, the gain of the probe 100 remains relatively constant over a broad frequency spectrum. The inductor LP has virtually no effect on the poles and zeros of the matching network 132. As described below, the function of the inductor LP is primary to compensate for the affect the input impedance of the measuring device 102, which is represented by the capacitor $C_L$.

The description above assumes ideal conditions of the measuring device 102 wherein there is no input capacitance $C_L$ into the measuring device 102. Under more realistic conditions, the input to the measuring device 102 has the capacitance $C_L$ associated therewith. The capacitance $C_L$, in summary, creates a capacitance discontinuity through the capacitor C2 which inhibits the ability of the termination portion 150 to terminate the transmission line 126. Accordingly, the capacitance $C_L$ causes the gain of the probe 100 to decrease as the input frequency is increased. The inductor $L_P$ serves to offset the capacitive discontinuity of $C_L$. Accordingly, the inductor $L_P$ will cause the gain of the probe 100 to remain substantially constant over a greater frequency spectrum.

Having described the operation of the probe 100, non-limiting examples of values for the components within probe 100 will now be provided. In a non-limiting embodiment described herein, the characteristic impedance of the transmission line 126 may be seventy-five ohms. A non-limiting example of values of other components are listed in Table 1.

TABLE 1

| Component | Value |
|---|---|
| $R_t$ | 422 ohms |
| $R_1$ | 75 ohms |
| $C_1$ | 0.01 microfarads |
| $C_2$ | 168 picofarads |
| $R_2$ | 33.64 k ohms |
| $R_3$ | 5 k ohms |
| $C_L$ | 4 picofarads |
| $L_P$ | 10 nanohenries |

The probe 100 described herein is an electronic probe that does not overload tri-state circuits at low frequency. Thus, the probe 100 overcomes the low impedance loading limitations of conventional probes, including resistive divider probes, and may be used to measure voltages within circuits using tri-state logic devices. The probe 100 may be limited solely to a having a limited number of passive component, thus, no relatively expensive active components are required within the probe 100. The limited number of components allows the overall size of the probe 100 to be minimized. Therefore, a plurality of probes 100 may be used to measure a plurality of voltages within tight confines. In addition, the use of a single probe tip resistive component, the tip resistor $R_t$, serves to further minimize the size of the probe 100.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An electronic probe comprising:
   a probe tip;
   a transmission line having a transmission line first end and a transmission line second end, said transmission line first end being connected to said probe tip;
   a termination portion comprising a termination portion first end and a termination portion second end, said termination portion first end being connected to said transmission line second end, said termination portion second end being connected to a common node, said termination portion comprising a termination resistor and a termination capacitor connected in series between said termination portion first end and said termination portion second end; and
   a filter comprising a filter first end and a filter second end, said filter first end being connected to said transmission line second end, and said filter second end being connected to a probe output, said filter comprising a filter resistor connected in parallel with a filter capacitor and a filter inductor connected in series with said filter resistor and filter capacitor combination; and
   an impedance device connected between said probe output and said common node.

2. The electronic probe of claim 1 and further comprising a tip resistor connected between said probe tip and said transmission line first end.

3. The electronic probe of claim 2, wherein said tip resistor in integral to said probe tip.

4. The electronic probe of claim 2, wherein the value of said tip resistor is approximately four-hundred twenty-two ohms.

5. The electronic probe of claim 1, wherein said impedance device is a resistor.

6. The electronic probe of claim 1, wherein said probe output is electrically connectable to an electronic device having an input capacitance associated therewith, and wherein the value of said filter inductor is approximately equal to 0.4 multiplied by the value of said termination resistor squared multiplied by the value of said filter capacitor in parallel with said input capacitance.

7. The electronic probe of claim 1, wherein the value of said filter inductor is approximately ten nanohenries.

8. The electronic probe of claim 1, wherein the value of said filter resistor is approximately 33.64 kilohms.

9. The electronic probe of claim 1, wherein the value of said filter capacitor is approximately one-hundred sixty-eight picofarads.

10. The electronic probe of claim 1, wherein at least one pole is associated with said filter in conjunction with said impedance device, wherein at least one zero is associated with said termination portion and wherein the frequency of said at least one pole is substantially equivalent to the frequency of said at least one zero.

11. The electronic probe of claim 1, wherein said probe has a gain associated therewith between said probe tip and said probe output and wherein said gain is approximately uniform over a frequency spectrum of direct current to a preselected frequency.

12. The electronic probe of claim 1, wherein said probe output is electrically connectable to an electronic device having an input capacitance associated therewith, wherein at least one pole is associated with said filter in conjunction with said impedance device and said electronic device, wherein at least one zero is associated with said termination portion, and wherein the frequency of said at least one pole is substantially equivalent to the frequency of said at least one zero.

13. An electronic probe comprising:

a probe tip;

a tip resistor having a tip resistor first end and a tip resistor second end, said tip resistor first end being connected to said probe tip;

a transmission line having a transmission line first end and a transmission line second end, said transmission line first end being connected to said tip resistor second end;

a termination portion comprising a termination portion first end and a termination portion second end, said termination portion first end being connected to said transmission line second end, said termination portion second end being connected to a common node, said termination portion comprising a termination resistor and a termination capacitor connected in series between said termination portion first end and said termination portion second end; and a filter comprising a filter first end and a filter second end, said filter first end connected to said transmission line second end, and said filter second end connected to a probe output, said filter comprising a filter resistor connected in parallel with a filter capacitor and a filter inductor connected in series with said filter resistor and filter capacitor combination; and an impedance device connected between said probe output and said common node;

wherein at least one zero is associated with said termination portion;

wherein at least one pole is associated with said filter in combination with said impedance device; and wherein the frequency of said at least one pole is substantially equivalent to the frequency of said at least one zero.

14. The electronic probe of claim 13, wherein said tip resistor is integral to said probe tip and wherein said transmission line first end is connected to said probe tip.

15. The electronic probe of claim 13, wherein said impedance device is a resistor.

16. The electronic probe of claim 13, wherein said filter output is connectable to an electronic device having an input capacitance associated therewith.

* * * * *